United States Patent
Cao et al.

(10) Patent No.: US 9,716,113 B2
(45) Date of Patent: Jul. 25, 2017

(54) CONDUCTIVE STRUCTURE AND METHOD OF MANUFACTURING THE SAME, ARRAY SUBSTRATE

(71) Applicants: BOE Technology Group Co., Ltd., Beijing (CN); Hefei Xinsheng Optoelectronics Technology Co., Ltd., Anhui (CN)

(72) Inventors: Binbin Cao, Beijing (CN); Zhiyuan Lin, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 14/744,308

(22) Filed: Jun. 19, 2015

(65) Prior Publication Data
US 2016/0276369 A1 Sep. 22, 2016

(30) Foreign Application Priority Data
Mar. 19, 2015 (CN) .......................... 2015 1 0124556

(51) Int. Cl.
*H01L 27/12* (2006.01)
(52) U.S. Cl.
CPC ........ *H01L 27/124* (2013.01); *H01L 27/1262* (2013.01)
(58) Field of Classification Search
CPC ............... H01L 27/1262; H01L 27/124; H01L 21/76841–21/76876
See application file for complete search history.

(56) References Cited

U.S. PATENT DOCUMENTS 8,344,387 B2    1/2013  Akimoto et al.
8,546,182 B2   10/2013  Akimoto et al.
(Continued)

FOREIGN PATENT DOCUMENTS

CN    1622300 A    6/2005
CN  101752425 A    6/2010
CN  101771072 A    7/2010

OTHER PUBLICATIONS

First Office Action, including Search Report, for Chinese Patent Application No. 201510124556.6, dated Mar. 21, 2017, 11 pages.

*Primary Examiner* — Seahvosh Nikmanesh
(74) *Attorney, Agent, or Firm* — Westman, Champlin & Koehler, P.A.

(57) ABSTRACT

The present invention discloses a conductive structure, a method of manufacturing the conductive structure, and an array substrate. The method of manufacturing the conductive structure, comprising steps of: Forming a barrier metal film and a copper metal film in this order on a substrate, wherein the copper metal film being laminated on the barrier metal film; forming a preset photoresist pattern on the copper metal film; etching the barrier metal film and the copper metal film; oxidizing an exposed sidewall of the etched barrier metal film and an exposed sidewall of the etched copper metal film, so as to generate metal oxide layers on the exposed sidewall of the etched barrier metal film and the exposed sidewall of the etched copper metal film, respectively; and stripping off the photoresist pattern by means of a photoresist stripping liquid. In the method of manufacturing the conductive structure according to embodiments of the present invention, the exposed sidewall of the conductive structure is oxidized to generate a uniform metal oxidization layer on the exposed sidewall before removing the photoresist from the conductive structure by a wet stripping process. In this way, it can effectively prevent (Continued)

the interfaces between the copper metal film and the barrier metal film from being separated during performing the wet stripping process.

5 Claims, 2 Drawing Sheets

(56) References Cited

U.S. PATENT DOCUMENTS

| | | |
|---|---|---|
| 8,552,434 B2 | 10/2013 | Akimoto et al. |
| 2008/0050909 A1* | 2/2008 | Lin ..................... H01L 21/768 438/620 |
| 2014/0124784 A1 | 5/2014 | Chung et al. |
| 2015/0311170 A1* | 10/2015 | Arvin ..................... H01L 24/11 438/614 |

* cited by examiner

CONDUCTIVE STRUCTURE AND METHOD OF MANUFACTURING THE SAME, ARRAY SUBSTRATE

CROSS-REFERENCE TO RELATED APPLICATION

This application claims the benefit of Chinese Patent Application No. 201510124556.6 filed on Mar. 19, 2015 in the State Intellectual Property Office of China, the whole disclosure of which is incorporated herein by reference.

BACKGROUND OF THE INVENTION

Field of the Invention

The present invention relates to display technical field, more particularly, relates to a conductive structure, a method of manufacturing the conductive structure, and an array substrate.

Description of the Related Art

Since a liquid crystal display panel has many advantages, such as, light weight, low power consumption, low radiation, small volume, etc., it has replaced a conventional cathode ray tube display and is widely used in various display fields, such as, family, public place, office, personal electronic products, and so on.

In the prior art, the liquid crystal display panel mainly comprises a color film substrate, an array substrate and a liquid crystal layer between the color film substrate and the array substrate. With the increase of the size of the liquid crystal display panel and the higher requirements for the display performance, it needs to reduce resistance of a gate line and a data line on the array substrate. A wiring made of aluminum is unable to meet the requirements for the display performance because the aluminum wiring has higher resistance coefficient. Thereby, using a copper wiring as the gate line and the data line is becoming the mainstream technology in future because the resistance coefficient of the copper wiring is much lower than that of the aluminum wiring. Currently, during manufacturing the copper wiring on the array substrate, in order to prevent diffusion of copper and increase the adhesion force thereof, typically, it is necessary to provide a barrier metal film under the copper metal film. However, since arrangement of atoms at an interface between different metals is irregular, the interface energy between different metals becomes relative larger. As a result, as shown in FIG. 1, the copper metal film and the barrier metal film are likely to separate from each other at the interface therebetween (referred to as interface separation phenomenon or undercut) once the interface between the copper metal film and the barrier metal film is exposed to a photo resist stripping liquid during stripping off residual photo resist after etching the copper metal film and the barrier metal film below the copper metal film, thus decreasing the quality of the product.

SUMMARY OF THE INVENTION

The present invention has been made to overcome or alleviate at least one aspect of the above mentioned disadvantages.

According to an aspect of the present invention, there is provided a method of manufacturing a conductive structure, comprising steps of:

forming a barrier metal film and a copper metal film on a substrate in this order, wherein the copper metal film being laminated on the barrier metal film;

forming a preset photoresist pattern on the copper metal film;

etching the barrier metal film and the copper metal film;

oxidizing an exposed sidewall of the etched barrier metal film and an exposed sidewall of the etched copper metal film, so as to generate metal oxide layers on the exposed sidewall of the etched barrier metal film and the exposed sidewall of the etched copper metal film, respectively; and stripping off the photoresist pattern by means of a photoresist stripping liquid.

According to another aspect of the present invention, there is provided a conductive structure comprising a barrier metal layer and a copper metal layer laminated on each other, wherein each of the barrier metal layer and the copper metal layer is formed with a metal oxide layer on a sidewall thereof.

According to another aspect of the present invention, there is provided an array substrate comprising a gate line, a data line, a source electrode, a drain electrode, a gate electrode, wherein at least one of the gate line, the data line, the source electrode, the drain electrode and the gate electrode comprises the above conductive structure.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
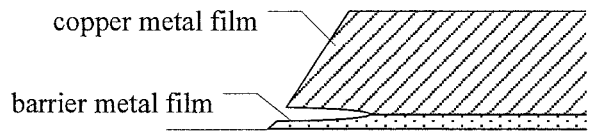
FIG. 1 is an illustrative view showing an interface separation phenomenon occurred between a copper metal film and a barrier metal film when a copper wiring is manufactured on an array substrate in the prior art.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
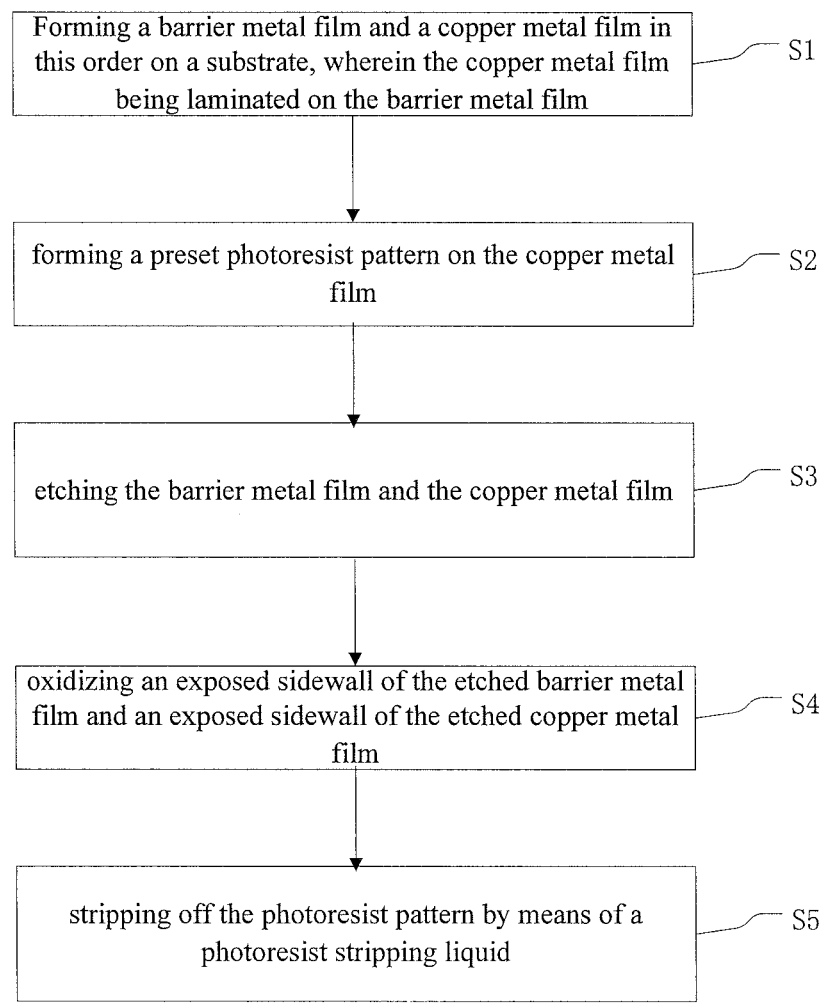
FIG. 2 is a flow chart showing a method of manufacturing a conductive structure according to an exemplary embodiment of the present invention.
Figure 3:
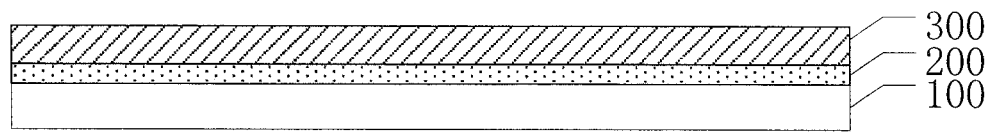
FIGS. 3-7 are illustrative views showing the process for manufacturing a conductive structure according to an exemplary embodiment of the present invention.

FIG. 2 is a flow chart showing a method of manufacturing a conductive structure according to an exemplary embodiment of the present invention. The method of manufacturing the conductive structure comprises following steps S5-S5 of:

S1: Forming a barrier metal film and a copper metal film in this order on a substrate, wherein the copper metal film being laminated on the barrier metal film. In an embodiment, as shown in FIG. 3, a layer of barrier metal film 200 is firstly formed on the substrate 100, the barrier metal film may be made of Mo, MoNb, MoTi, and the like; secondly, a layer of copper metal film 300 is formed on the barrier metal film 200.

Figure 4:
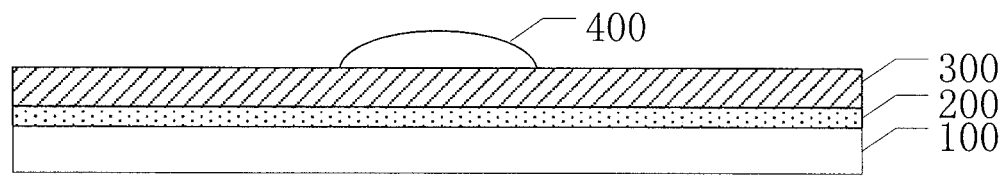

S2: forming a preset photoresist pattern on the copper metal film. In an embodiment, firstly, a layer of photoresist may be coated on the copper metal film; secondly, the photoresist layer is exposed with a mask, so as to form a photoresist completely reserved region (corresponding to a conductive pattern region) and a photoresist completely removal region (corresponding to a non-conductive pattern region); then, the exposed photoresist layer is developed, so that the photoresist in the photoresist completely removal region is completely removed, and only the photoresist in the photoresist completely reserved region is left. As a result, a photoresist pattern 400 as shown in FIG. 4 is formed.

Figure 5:
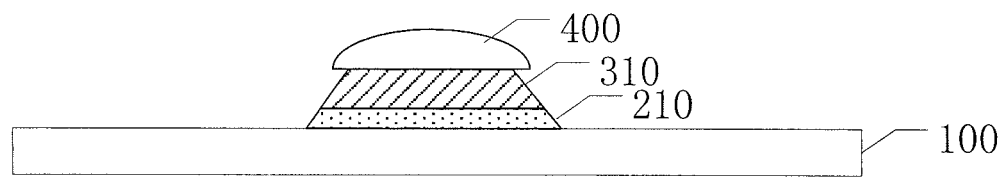
Figure 6:
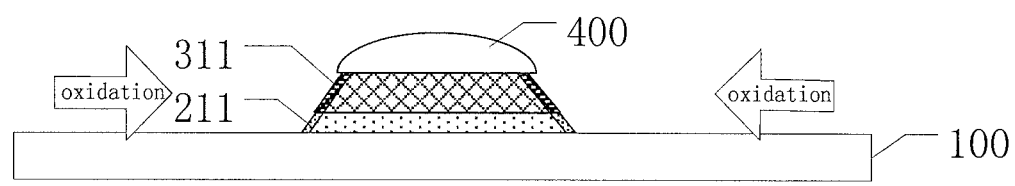

S3: etching the barrier metal film and the copper metal film. In an embodiment, the barrier metal film and the copper metal film in the photoresist completely removal region may be completely etched off by means of a wet etching, so as to form a conductive structure pattern shown in FIG. 5 as required, which comprises a patterned barrier metal layer 210 and a patterned copper metal layer 310;

S4: oxidizing an exposed sidewall of the etched barrier metal film and an exposed sidewall of the etched copper metal film, so as to generate metal oxide layers on the exposed sidewall of the etched barrier metal film and the exposed sidewall of the etched copper metal film, respectively. In an embodiment, as shown in FIG. 6, after oxidizing, metal oxide layers 211 and 311 are formed on the sidewalls of the barrier metal layer 210 and the copper metal layer 310, respectively. For instance, if the barrier metal layer 210 is made of Mo, after the above oxidizing, a layer of molybdenum oxide is formed on the sidewall of the barrier metal layer 210, and a layer of copper oxide is formed on the sidewall of the copper metal layer 310.

Figure 7:
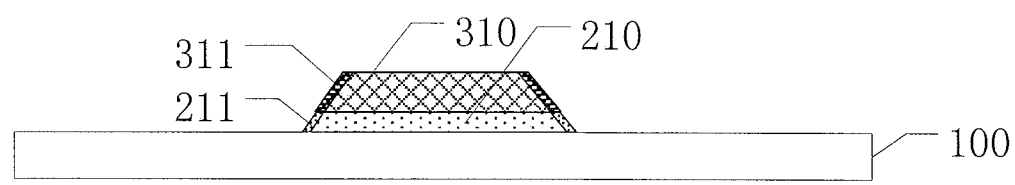

S5: stripping off the photoresist pattern by means of a photoresist stripping liquid. In an embodiment, as shown in FIG. 7, after the photoresist above the conductive structure is stripped off with a stripping liquid by a wet stripping process, the required conductive structure is completely presented on the substrate. Furthermore, since the sidewall of the barrier metal film 210 and the sidewall of the copper metal film 310 each are formed with a uniform metal oxide layer, the difference between the interfaces between the barrier metal film and the copper metal film and the upper and lower films is reduced. Thereby, during performing the wet stripping process, it reduces the possibility of corrosion caused by residual gas and liquid, effectively alleviating the interface separation phenomenon (undercut) between the copper metal film and the barrier metal film, and increasing the stability of the assembly.

In an embodiment, in the step S4, the exposed sidewall of the barrier metal film and the exposed sidewall of the copper metal film may be oxidized by any one of following ways (1)~(3) of:

(1) performing an oxygen plasma ($O_2$ plasma) treatment on the exposed sidewall of the etched barrier metal film and the exposed sidewall of the etched copper metal film;

(2) performing an ozone ($O_3$) treatment on the exposed sidewall of the etched barrier metal film and the exposed sidewall of the etched copper metal film; or (3) placing the exposed sidewall of the etched barrier metal film and the exposed sidewall of the etched copper metal film in the air, and heating the exposed sidewall of the etched barrier metal film and the exposed sidewall of the etched copper metal film in the air.

In the method of manufacturing the conductive structure according to embodiments of the present invention, the exposed sidewall of the conductive structure is oxidized to generate a uniform metal oxidization layer on the exposed sidewall before the photoresist is removed from the conductive structure by the wet stripping process. In this way, the difference between the interfaces between the barrier metal film and the copper metal film and the upper and lower films is reduced. Thereby, during performing the wet stripping process, it reduces the possibility of corrosion caused by residual gas and liquid, effectively alleviating the interface separation phenomenon (undercut) between the copper metal film and the barrier metal film, and increasing the stability of the assembly.

The above method of manufacturing the conductive structure according to embodiments of the present invention may be used to manufacture a gate line, a data line, a source electrode, a drain electrode and a gate electrode on an array substrate. With the above method, it can effectively alleviate the interface separation phenomenon between the copper metal film and the barrier metal film occurred in the process of manufacturing wirings on the array substrate, increasing the product qualification rate.

In another exemplary embodiment of the present invention, there is also provided a conductive structure comprising a barrier metal layer and a copper metal layer laminated on each other, wherein the barrier metal layer and the copper metal layer each are formed with a metal oxide layer on a sidewall thereof.

In an embodiment, the barrier metal film is made of Mo, MoNb or MoTi. Particularly, the conductive structure is made by the above method. As described above, a uniform metal oxidization layer is formed on the sidewall of the conductive structure before removing the photoresist from the conductive structure, which effectively alleviates the interface separation phenomenon (undercut) between the copper metal film and the barrier metal film, and significantly increasing the reliability of the product.

In another exemplary embodiment of the present invention, there is also provided an array substrate comprising a gate line, a data line, a source electrode, a drain electrode and a gate electrode, wherein at least one of the gate line, the data line, the source electrode, the drain electrode and the gate electrode comprises the above conductive structure.

In another exemplary embodiment of the present invention, there is also provided a display apparatus comprising the above array substrate. The display device may comprise any product or component with display function, such as, a display panel of notebook computer, a liquid crystal display (LCD), a LCD TV, a digital photo frame, a mobile phone, a panel computer, and so on.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A method of manufacturing a conductive structure, comprising steps of:
    forming a barrier metal film on a substrate and a copper metal film on the barrier metal film, such that the copper metal film is laminated on the barrier metal film;
    forming a preset photoresist pattern on the copper metal film after forming the preset photoresist pattern;
    etching the barrier metal film and the copper metal film;
    oxidizing an exposed sidewall of the etched barrier metal film and an exposed sidewall of the etched copper metal film after the step of etching the barrier metal film and the copper metal film, so as to generate metal oxide layers on the exposed sidewall of the etched barrier metal film and the exposed sidewall of the etched copper metal film, respectively; and
    stripping off the photoresist pattern by means of a photoresist stripping liquid after the oxidizing step.

2. The method according to claim 1, wherein the barrier metal film is made of Mo, MoNb or MoTi.

3. The method according to claim 1, wherein oxidizing an exposed sidewall of the etched barrier metal film and an exposed sidewall of the etched copper metal film comprising:
    performing an oxygen plasma treatment on the exposed sidewall of the etched barrier metal film and the exposed sidewall of the etched copper metal film.

4. The method according to claim 1, wherein oxidizing an exposed sidewall of the etched barrier metal film and an exposed sidewall of the etched copper metal film comprising:
    performing an ozone treatment on the exposed sidewall of the etched barrier metal film and the exposed sidewall of the etched copper metal film.

5. The method according to claim 1, wherein oxidizing an exposed sidewall of the etched barrier metal film and an exposed sidewall of the etched copper metal film comprising:
    placing the exposed sidewall of the etched barrier metal film and the exposed sidewall of the etched copper metal film in the air, and heating the exposed sidewall of the etched barrier metal film and the exposed sidewall of the etched copper metal film in the air.

* * * * *